(12) United States Patent
Noderer et al.

(10) Patent No.: US 11,821,355 B2
(45) Date of Patent: *Nov. 21, 2023

(54) SUPPLEMENT THERMAL MANAGEMENT SYSTEM COOLING USING THERMOELECTRIC COOLING

(71) Applicant: Rolls-Royce North American Technologies Inc., Indianapolis, IN (US)

(72) Inventors: Keith D. Noderer, Carmel, IN (US); Eric S. Donovan, Fishers, IN (US)

(73) Assignee: ROLLS-ROYCE NORTH AMERICAN TECHNOLOGIES INC., Indianapolis, IN (US)

( * ) Notice: Subject to any disclaimer, the term of this patent is extended or adjusted under 35 U.S.C. 154(b) by 127 days.

This patent is subject to a terminal disclaimer.

(21) Appl. No.: 17/245,344

(22) Filed: Apr. 30, 2021

(65) Prior Publication Data

US 2021/0404374 A1  Dec. 30, 2021

Related U.S. Application Data

(62) Division of application No. 15/679,730, filed on Aug. 17, 2017, now Pat. No. 10,995,656.

(51) Int. Cl.
| | |
|---|---|
| *F02B 29/04* | (2006.01) |
| *F25B 21/02* | (2006.01) |
| *F01K 23/06* | (2006.01) |
| *F01P 3/12* | (2006.01) |
| *F01N 5/02* | (2006.01) |
| *F28D 21/00* | (2006.01) |

(Continued)

(52) U.S. Cl.
CPC ........ *F02B 29/0481* (2013.01); *F01K 23/065* (2013.01); *F01P 3/12* (2013.01); *F25B 21/02* (2013.01); *F01N 5/025* (2013.01); *F25B 2321/0212* (2013.01); *F28D 21/0001* (2013.01); *F28D 2021/0068* (2013.01); *F28F 9/0275* (2013.01); *H10N 10/13* (2023.02); *H10N 10/17* (2023.02)

(58) Field of Classification Search
CPC ....... F02B 29/0481; F01K 23/065; F01P 3/12; F01N 5/025; F25B 21/02; F25B 2321/0212; H01L 35/30; H01L 35/32; F28D 21/0001
See application file for complete search history.

(56) References Cited

U.S. PATENT DOCUMENTS

| | | |
|---|---|---|
| 6,000,225 A | 12/1999 | Ghoshal |
| 6,105,659 A | 8/2000 | Pocol |

(Continued)

*Primary Examiner* — Joel M Attey
(74) *Attorney, Agent, or Firm* — Crowell & Moring LLP

(57) ABSTRACT

Systems and methods to increase the recharge rate of a supplemental cooling system are provided. The system may include a primary cooling system configured to cool a thermal load, a supplemental cooling system, and a thermoelectric cooling apparatus. The thermoelectric cooling apparatus may assist the primary cooling system in recharging the supplemental cooling system in response to the supplemental cooling system operating in a recharge state, to the availability of electrical capacity, and to one or more operating parameters of the primary cooling system falling outside a predetermined range, wherein the operating parameter affects a cooling capacity of the primary cooling system.

6 Claims, 4 Drawing Sheets

(51) Int. Cl.
 *F28F 9/02* (2006.01)
 *H10N 10/13* (2023.01)
 *H10N 10/17* (2023.01)

(56) References Cited

U.S. PATENT DOCUMENTS

| | | | |
|---|---|---|---|
| 2006/0266043 A1* | 11/2006 | Jerome | F02G 5/00 |
| | | | 60/651 |
| 2010/0095674 A1* | 4/2010 | McMillan | F01K 25/10 |
| | | | 165/104.21 |
| 2013/0192271 A1 | 8/2013 | Barnhart et al. | |
| 2013/0219872 A1 | 8/2013 | Gibble et al. | |
| 2016/0181500 A1 | 6/2016 | Lin et al. | |
| 2018/0283737 A1* | 10/2018 | Diamond | F25B 41/00 |

\* cited by examiner

SUPPLEMENT THERMAL MANAGEMENT SYSTEM COOLING USING THERMOELECTRIC COOLING

CROSS-REFERENCE TO RELATED APPLICATIONS

This application is a divisional application of, and claims priority under 35 USC § 120 to, U.S. non-provisional application Ser. No. 15/679,730, filed Aug. 17, 2017, the entire contents of which are incorporated by reference.

TECHNICAL FIELD

This disclosure relates to thermal management systems and, in particular, to thermoelectric cooling in thermal management systems.

BACKGROUND

A system involving high thermal loads may benefit from a cooling system that maintains suitable temperatures at the load. A failure of the system to maintain suitable temperatures may cause the system to fail or to become damaged.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

By way of an introductory example, a cooling system is provided including a primary cooling system configured to cool a thermal load, a supplemental cooling system, and a thermoelectric cooling apparatus. The supplemental cooling system may be configured to supplement the primary cooling system and cool the thermal load. Alternatively, or in addition, the supplemental cooling system may operate in a recharge state and the primary cooling system may be configured to supply cooling to the supplemental cooling system in response to the supplemental cooling system operating in the recharge state. The thermoelectric cooling apparatus may be configured to supply cooling to the supplemental cooling system in response to the operation of the supplemental cooling system in the recharge state, to an availability of electricity for the thermoelectric cooling apparatus, and to one or more operating parameters of the primary cooling system falling outside a predetermined range, wherein the operating parameter affects a cooling capacity of the primary cooling system.

The thermoelectric cooling apparatus may be remotely or manually activated in response to the primary cooling system operating outside of a threshold range and the supplemental cooling system operating in a supplemental cooling system recharge state resulting in the electrical source having available electrical capacity.

One interesting feature of the systems and methods described below may be that a supplemental cooling system may regain cooling capacity faster than some known systems. Alternatively, or in addition, an interesting feature of the systems and methods described below may be that relatively small thermal loads may be adequately cooled without the implementation of costly, physically larger known alternatives.

Figure 1:
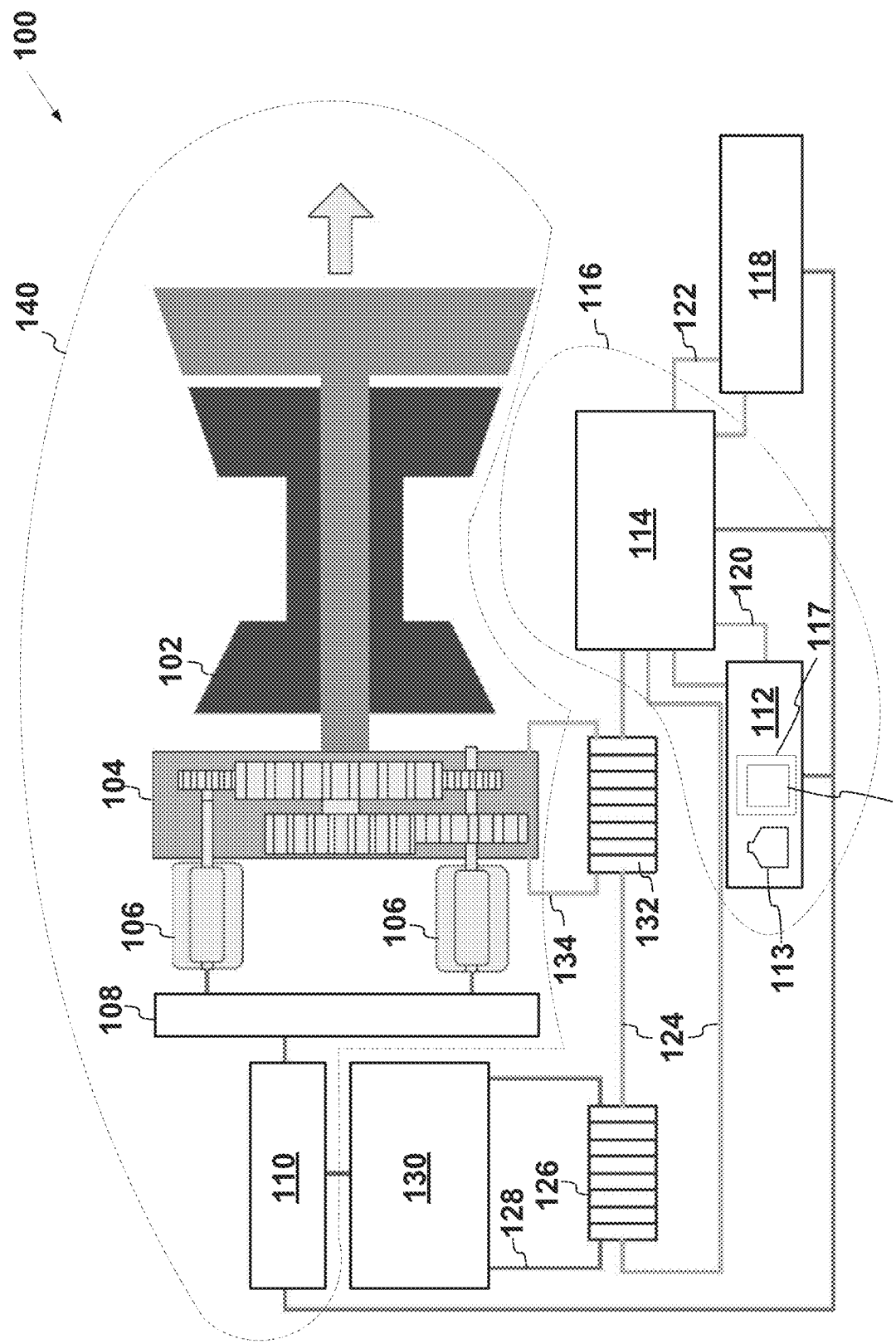
FIG. 1 illustrates a schematic of an example of an integrated power and thermal management system.

FIG. 1 illustrates a schematic of an example of an integrated power and thermal management system 100. The system 100 may include an engine 102, a gearbox 104, a generator 106 (two generators are shown in FIG. 1), an electrical bus 108 for the generator 106, power electronics 110, thermal management system components 112, and thermal management coolant loops 114.

The engine 102 may include any source of mechanical power that can drive the generator 106. Examples of the engine 102 may include a gas turbine engine, an internal combustion engine, a gas engine, a reciprocating engine, a diesel engine, a turbo fan, any other type of engine, propeller(s) of a wind turbine, and any other source of mechanical power. The engine 102 represented in FIG. 1 is a gas turbine engine.

The gearbox 104 may include any device that performs speed and/or torque conversions from a rotating power source to another device. Examples of the gearbox 104 may include gears, a gear train, a transmission, or any other type of device that performs rotational speed and/or torque conversions.

The generator 106 may include any type of electrical generator. Examples of the generator 106 may include a synchronous generator, an induction generator, an asynchronous generator, a permanent magnet synchronous generator, an AC (Alternating Current) generator, a DC (Direct Current) generator, a synchronous generator with stator coils, or any other device that converts mechanical power to electric power.

The electrical bus 108 may include any connector or connectors that conduct electricity. Examples of the electrical bus 108 may include a busbar, a busway, a bus duct, a solid tube, a hollow tube, a wire, an electrical cable, or any other electrical conductor.

The power electronics 110 may include any device or combination of devices that control and/or convert electric power. Examples of the power electronics 110 may include a power converter, a rectifier, an AC to DC converter, a DC to DC converter, a switching device, a diode, a thyristor, an inverter, a transistor, and a capacitor. The power electronics 110 may include semiconductor and/or solid state devices.

The thermal management system components 112 may include any component of a thermal management system. Examples of the thermal management system components 112 may include a thermal energy storage (TES) 113, a vapor cycle system (VCS) 117, a conventional air cycle system (ACS), a compressor, a valve, a gas cooler, a heat exchanger, a recuperator, an evaporator, a condenser, a battery, a coolant pump, a controller, a thermoelectric cooling apparatus 115, and any other component of any type of cooling system. In some examples, the VCS 117 includes the thermoelectric cooling apparatus 115. The thermal management system components 112 together and/or separately may have a capability to provide cooling and/or heating.

As described in more detail below, the cooling and/or heating provided by the thermal management system components 112 may be distributed by a coolant, such as ethylene glycol and water (EGW) or propylene glycol and water (PGW), through the thermal management coolant loops 114. In more general terms, the combination of the thermal management system components 112 and the thermal management coolant loops 114 form a thermal management system 116. The thermal management system 116 may provide cooling and/or heating to one or more target devices or target components.

During operation of the integrated power and thermal management system 100 (IPTMS), the IPTMS 100 may provide electrical power to a customer platform component 118. Alternatively or in addition, the IPTMS 100 may cool and/or heat the customer platform component 118. The electrical power may by generated by the generator 106 of the IPTMS 100 and the cooling and/or the heating may be provided by the thermal management system 116 of the IPTMS 100.

The customer platform component 118 may include any device or combination of devices that consumes electricity that may benefit from cooling and/or heating. Examples of the customer platform component 118 may include solid state electronics, a light-emitting diode (LED), an analog circuit, a digital circuit, a computer, a server, a server farm, a data center, a hoteling circuit such as vehicle electronics, a vehicle, an aircraft, a directed-energy weapon, a laser, a plasma weapon, a railgun, a microwave generator, a pulse-powered device, a satellite uplink, an electrically-driven machine, or any other electronic device that benefit from heating and/or cooling.

The integrated power and thermal management system 100 may be considered "integrated" because electrical power generated by the IPTMS 100 may power devices within the IPTMS 100, such as components of the thermal management system 116. Alternatively or in addition, the thermal management system 116 may cool and/or heat components of the IPTMS 100, such as the power electronics 110, the gear box 104, or any component of the engine 102.

For example, a first loop 120 may be cooled by the thermal management system components 112. The cooled coolant in the first loop 120 may cool a coolant in a second loop 122 via a heat exchanger (not shown). In cooling the coolant in the second loop 122, the coolant in the first loop 120 may become warmer. The warmed coolant in the first loop 120 may be pumped back to the thermal management system components 112 where the coolant is again cooled. Meanwhile, the cooled coolant in the second loop 122 may be pumped to the customer platform component 118 where the coolant cools the customer platform component 118. In cooling the customer platform component 118, the coolant in the second loop 122 may become warmer. The warmed coolant in the second loop 122 may be pumped back to the heat exchanger where the coolant is again cooled by the first loop 120 via the heat exchanger.

In another example, the cooled coolant in the first loop 120 may cool a coolant in a third loop 124 via a heat exchanger (not shown) in a similar manner. The cooled coolant in the third loop 124 may cool the power electronics 110 by passing through a power electronics heat exchanger 126 that cools a coolant in a fourth loop 128. The cooled coolant in the fourth loop 128 may cool the power electronics 110 and/or cool one or more additional independent cooling loops 130 that in turn cool the power electronics 110.

Alternatively or in addition, the cooled coolant in the third loop 124 (or the warmed coolant in the third loop 124 that exits the power electronics heat exchanger 126) may pass through a gear box heat exchanger 132. The coolant in the third loop 124 that passes through the gear box heat exchanger 132 may cool oil in an oil loop 134 that flows through the gear box 104. In such a configuration, the thermal management system 116 may cool the oil in the gear box 104.

The thermal management coolant loops 114, such as the first loop 120, the second loop 122, the third loop 124, and the fourth loop 128, that are illustrated in FIG. 1 are simply examples of the thermal management coolant loops 114. In other examples, the thermal management coolant loops 114 may include additional, fewer, or different coolant loops than shown in FIG. 1. Alternatively or in addition, the thermal management system 116 may cool additional, fewer, or different components of the IPTMS 100 than shown in FIG. 1.

With respect to generating electrical power, the engine 102 may cause a shaft of the generator 106 to rotate via the gearbox 104 during operation of the IPTMS 100. As the shaft of the generator 106 rotates, the generator 106 may generate electricity. The electrical bus 108 may transmit the generated electricity to the power electronics 110. The power electronics 110 may transform, control, and/or store the generated electricity. For example, the power electronics 110 may convert AC current generated by the generator 106 into DC current for delivery to the customer platform component 118. The power electronics 110 may deliver electricity to one or more components of the thermal management system 116 and/or to any other component of the IPTMS 100. In more general terms, the combination of the engine 102, the gearbox 104, the generator 106, the electrical bus 108, and the power electronics 110 may form an electrical source 140. The electrical source 140 may provide electric power in the form of electricity to one or more target devices or target components.

The thermal management components 112 may include one or more thermal energy storage (TES) 113. In some examples, the TES 113 may be electrically powered by the electrical source 140. The TES 113 may include any apparatus capable of absorbing thermal power and/or storing thermal energy. In some examples, the TES 113 may include a tank for storing a gaseous or non-gaseous fluid. In other examples, the TES 113 may include a structure and/or liquid that absorbs thermal power. The TES 113 may include phase-change material. The TES 113 may be cooled to increase the amount of heat that the TES 113 may absorb.

The TES 113 may operate in a TES use state. Alternatively, the TES 113 may operate in a TES recharge state. These states of operation of the TES 113 are discussed in greater detail below. The VCS 117 may recharge the TES 113 in response to the TES 113 operating in the TES recharge state. Alternatively or in addition, the VCS 117 may be assisted in recharging the TES 113 by another component, for example the thermoelectric cooling apparatus 115. The rate of recharge of the TES 113 may be increased in response to the VCS 117 being assisted in recharging the TES 113.

The VCS 117 may be a primary cooling system for the IPTMS 100. Alternatively or in addition, the VCS 117 may be a cooling system for components utilizing the IPTMS 100, such as for example, the customer platform component 118. In some examples, the VCS 117 may be electrically powered by the electrical source 140. In some examples, during operation of the IPTMS 100, the VCS 117 may cool and distribute the coolant(s).

In some examples, operating parameters may affect the cooling capacity of the VCS 117 in response to the operating parameters being outside a predetermined operating range. The operating parameters of the VCS 117 may be any parameter that affects the cooling capacity of the VCS 117. Examples of operating parameters may include, but are not limited to, ambient temperature, ambient pressure, internal pressure, internal temperature, internal humidity, or external humidity.

The predetermined operating range may include the range of values that the operating parameters may be in order for the VCS 117 to maintain at least sufficient cooling capacity to avoid damaging or destroying the customer platform component 118. Examples of the predetermined operating range may be a predetermined ambient temperature range, a predetermined ambient pressure range, a predetermined internal pressure range, a predetermined internal temperature range, a predetermined internal humidity range, or a predetermined external humidity range.

As an illustration: if one of the operating parameters of the VCS 117, for example ambient temperature, is outside of the predetermined operating range, for example the predetermined ambient temperature range, then the VCS 117 may lose some of the VCS's 117 cooling capacity.

In some examples, additional components may supplement the cooling provided by the VCS 117. The additional components together with the VCS 117 may enable the IPTMS 100 to successfully provide at least sufficient cooling capacity to avoid damaging or destroying the customer platform component 118, even in response to the operating parameter VCS 117 being outside the predetermined operating range.

The IPTMS 100 may include additional, fewer, or different components than shown in FIG. 1. For example, the IPTMS 100 may include additional or fewer heat exchangers than shown in FIG. 1. As another example, the IPTMS 100 may not include the additional independent cooling loops 130 that cool the power electronics 110. In still another example, the power electronics 110 may be integrated with the generator 106 so as to eliminate the discrete electrical bus 108 shown in FIG. 1. In yet another example, the IPTMS 100 may include a single generator. In some examples, the IPTMS 100 may not include the gearbox 104. Instead, the generator 106 may be directly coupled to a mechanical output, such as a shaft, of the engine 102.

Figure 2:
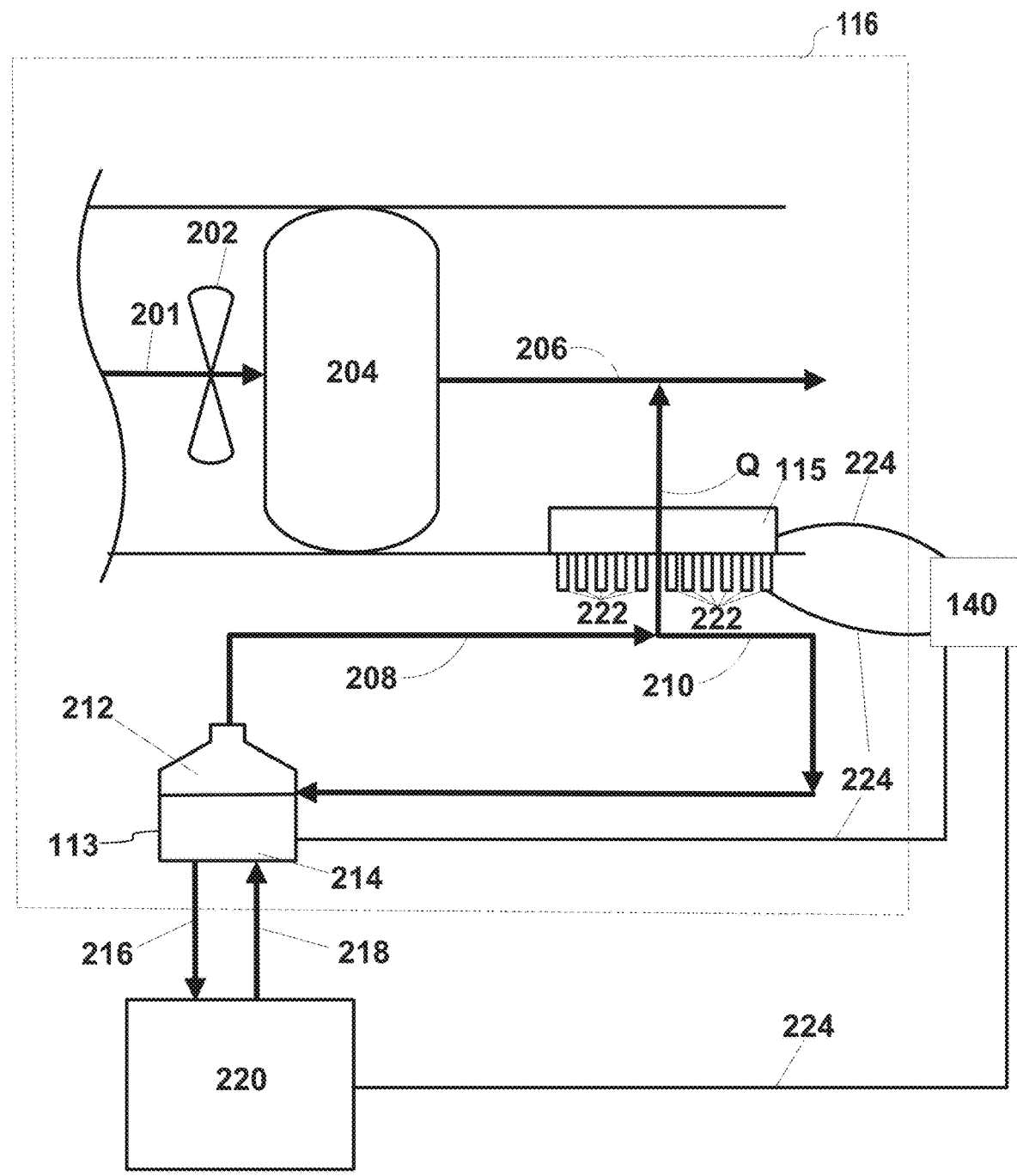
FIG. 2 illustrates a diagram of an example of a system utilizing a thermoelectric cooling apparatus to recharge a thermal energy storage.

As mentioned above, the thermal management system components 112 may include any component of a thermal management system. FIG. 2 illustrates an example of a portion of the thermal management system 116. The thermal management system 116 may include additional or fewer components than those shown in FIG. 2. For example, the thermal management system 116 may include the VCS 117. FIG. 2 illustrates a portion of the VCS 117 that may include a fan 202, located in for example an inlet stream 201, a gas cooler 204, a discharge stream 206, and the thermoelectric cooling apparatus 115.

During operation of the VCS 117, the fan 202 may blow a suitably cooled fluid, for example water, air, or other gas, into for example the gas cooler 204 via the inlet stream 201. The fluid may then be utilized in the VCS 117 and eventually exit the VCS 117, for example by the gas cooler 204, in for example, the discharge stream 206, to, for example, continue through the rest of the thermal management system 116. The fluid may encounter a thermoelectric cooling apparatus 115 in, for example, the discharge stream 206. Alternatively, or in addition, the fluid may encounter the thermoelectric cooling apparatus 115 at a location in parallel with the gas cooler 204. Alternatively or in addition, the fluid may encounter the thermoelectric cooling apparatus 115 within a housing of the compressor. Alternatively or in addition, the fluid may encounter the thermoelectric cooling apparatus 115 in any location where a temperature difference occurs and electricity is available to power the thermoelectric cooling apparatus 115.

The thermoelectric cooling apparatus 115 may be an apparatus configured to cool, for example, the TES 113 or the cooling fluid 214. Alternatively or in addition, the thermoelectric cooling apparatus 115 may be an apparatus capable of providing thermal communication between the discharge stream 206 and other portions of the thermal management system 116. The thermoelectric cooling apparatus 115 may be activated remotely or manually. Alternatively or in addition, the thermoelectric cooling apparatus 115 may be electrically powered by the electrical source 140. Powering of the thermoelectric cooling apparatus 115 may be in response to the TES 113 operating in the TES recharge state. Electrical capacity may be available from the electrical source 140 in response to the TES 113 operating in the TES 113 recharge state. The thermoelectric cooling apparatus 115 may utilize the available electrical capacity to assist the VCS 117 recharging the TES 113 in response to the TES 113 operating in the TES recharge state.

Alternatively or in addition, the thermoelectric cooling apparatus 115 may provide thermal communication between components. For example, the thermoelectric cooling apparatus 115 may provide thermal communication between the discharge stream 206, and other portions of the IPTMS 100, such as between the power electronics 110 and the discharge stream 206 or between the customer platform component 118 and the discharge stream 206. The thermoelectric cooling apparatus 115 may supply cooling capacity to maintain a thermal load system 220 below a thermal threshold. In some examples, the thermoelectric cooling apparatus 115 may directly supply the cooling capacity to maintain the thermal load system 220 below the thermal threshold. Examples of the thermoelectric cooling apparatus 115 may include a Peltier cooler. The thermal threshold is explained in more detail below.

As explained above, the thermal management coolant loops 114 may include additional, fewer, or different coolant loops than shown in FIG. 1. Referring to FIG. 2, the thermal management coolant loops 114 may include a depleted stream 208, a recharged stream 210, a cooling stream 216 and a return stream 218.

In some examples, the thermoelectric cooling apparatus 115 may include one or more fins 222. The fins 222 may be protrusions extending from the thermoelectric cooling apparatus 115. The fins 222 may be in thermal communication with the fluid in the depleted stream 208, the fluid in the recharged stream 210, the fluid in the discharge stream 206, or any combination of these streams. The fins 222 may be integral to the thermoelectric cooling apparatus 115. Alternatively, the fins 222 may be coupled to the thermoelectric cooling apparatus 115. The fins 222 may exchange heat between streams in which the fins 222 thermally communicate. The fins 222 may have any shape or combination of shapes. For example, the fins 222 may be pins, wedges, rectangular slabs, polyhedrons, or non-polyhedrons.

The inlet stream 201 may be a channel that allows for a flow of fluid. The flow of fluid may be, for example, into the gas cooler 204. Fluid flow through the inlet stream 201 may include laminar flow, turbulent flow, or both. The inlet stream 201 may include internal structures that disrupt the flow of fluid in the inlet stream 201 in order to facilitate turbulent flow. Alternatively or in addition, the inlet stream 201 may narrow in diameter from upstream to downstream. Alternatively or in addition, the inlet stream 201 may widen in diameter from upstream to downstream.

The gas cooler 204 may be an apparatus that is included in the VCS 117. The gas cooler 204 may be, for example, an apparatus that cools using gas flow. The gas cooler 204 may be cooled by fuel, air, polyalphaolefin (PAO), water, any secondary refrigerant, fan bypass air, or any available appropriate system. Alternatively or in addition, the gas cooler 204 may be an apparatus that cools refrigerants that have received heat from a compression system.

The discharge stream 206 may be a channel that allows for a flow of fluid. The flow of fluid may be, for example, out of the gas cooler 204. Fluid flow through the discharge stream 206 may include laminar flow, turbulent flow, or both. The discharge stream 206 may include internal structures that disrupt the flow of fluid in the discharge stream 206 in order to facilitate turbulent flow. Alternatively or in addition, the discharge stream 206 may narrow in diameter from upstream to downstream. Alternatively or in addition, the discharge stream 206 may widen from upstream to downstream. The fluid in the discharge stream 206 may encounter the thermoelectric cooling apparatus 115.

As explained above, the thermal management components 112 may include one or more TES 113. In some examples, the TES 113 may include a cooling reservoir 212. In some examples, the TES 113 may include a tank for storing gaseous or non-gaseous fluid, such as a cooling fluid 214.

The depleted stream 208 may be a channel that allows for a flow of fluid. The flow of fluid may be, for example, out of the TES 113 in response to the TES 113 operating in the TES 113 recharge state. Alternatively or in addition, fluid flow through the depleted stream 208 may include the cooling fluid 214. Alternatively or in addition, fluid flow through the depleted stream 208 may include laminar flow, turbulent flow, or both. Alternatively or in addition, the depleted stream 208 may include internal structures that may disrupt the flow of fluid in the depleted stream 208 in order to facilitate, for example, turbulent flow. Alternatively or in addition, the depleted stream 208 may narrow in diameter from upstream to downstream. Alternatively or in addition, the depleted stream 208 may widen in diameter from upstream to downstream.

The recharged stream 210 may be a channel that allows for a flow of fluid. The flow of fluid may be, for example, into the TES 113. Alternatively or in addition, fluid flow through the recharged stream 210 may include the cooling fluid 214. Alternatively or in addition, fluid flow through the depleted stream 208 may include laminar flow, turbulent flow, or both. Alternatively or in addition, the depleted stream 208 may include internal structures that may disrupt the flow of fluid in the depleted stream 208 in order to facilitate, for example, turbulent flow. Alternatively or in addition, the depleted stream 208 may narrow in diameter from upstream to downstream. Alternatively or in addition, the depleted stream 208 may widen in diameter from upstream to downstream.

A first heat flux Q may include an amount of heat transferred via the thermoelectric cooling apparatus 115. The first heat flux Q may transfer heat from the depleted stream 208 to the discharge stream 206. Alternatively, the first heat flux Q may transfer heat from the discharge stream 206 into the depleted stream 208. The first heat flux Q may be spontaneous or forced. For example, the first heat flux Q may occur spontaneously from the depleted stream 208 into the discharge stream 206 if, for example, the temperature of the fluid in the depleted stream 208 is greater than the temperature of the fluid in the discharge stream 206. Alternatively or in addition, the first heat flux Q may occur spontaneously from the discharge stream 206 into the depleted stream 208 if, for example, the fluid in the discharge stream 206 is higher in temperature than the fluid in the depleted stream 206. Alternatively or in addition, the first heat flux Q may be increased by the thermoelectric cooling apparatus 115. Alternatively or in addition, the spontaneous first heat flux Q may be increased by utilizing the thermoelectric cooling apparatus 115. Alternatively or in addition, the direction of the first heat flux Q may be forced by the thermoelectric cooling apparatus 115. For example, the thermoelectric cooling apparatus 115 may force or draw the heat in first heat flux Q from the TES 113 into the VCS 117. Alternatively or in addition, the heat in the first heat flux Q may be forced or drawn from the depleted stream 208 into the discharge stream 206 by the thermoelectric cooling apparatus 115, even if the temperature of the fluid in the depleted stream 208 is lower than the temperature of the fluid in the discharge stream 206. Alternatively or in addition, the first heat flux Q may be forced from the discharge stream 206 into the depleted stream 208 even if the temperature of the fluid in the discharge stream 206 is lower than the temperature of the fluid in the depleted stream 208.

Figure 3:
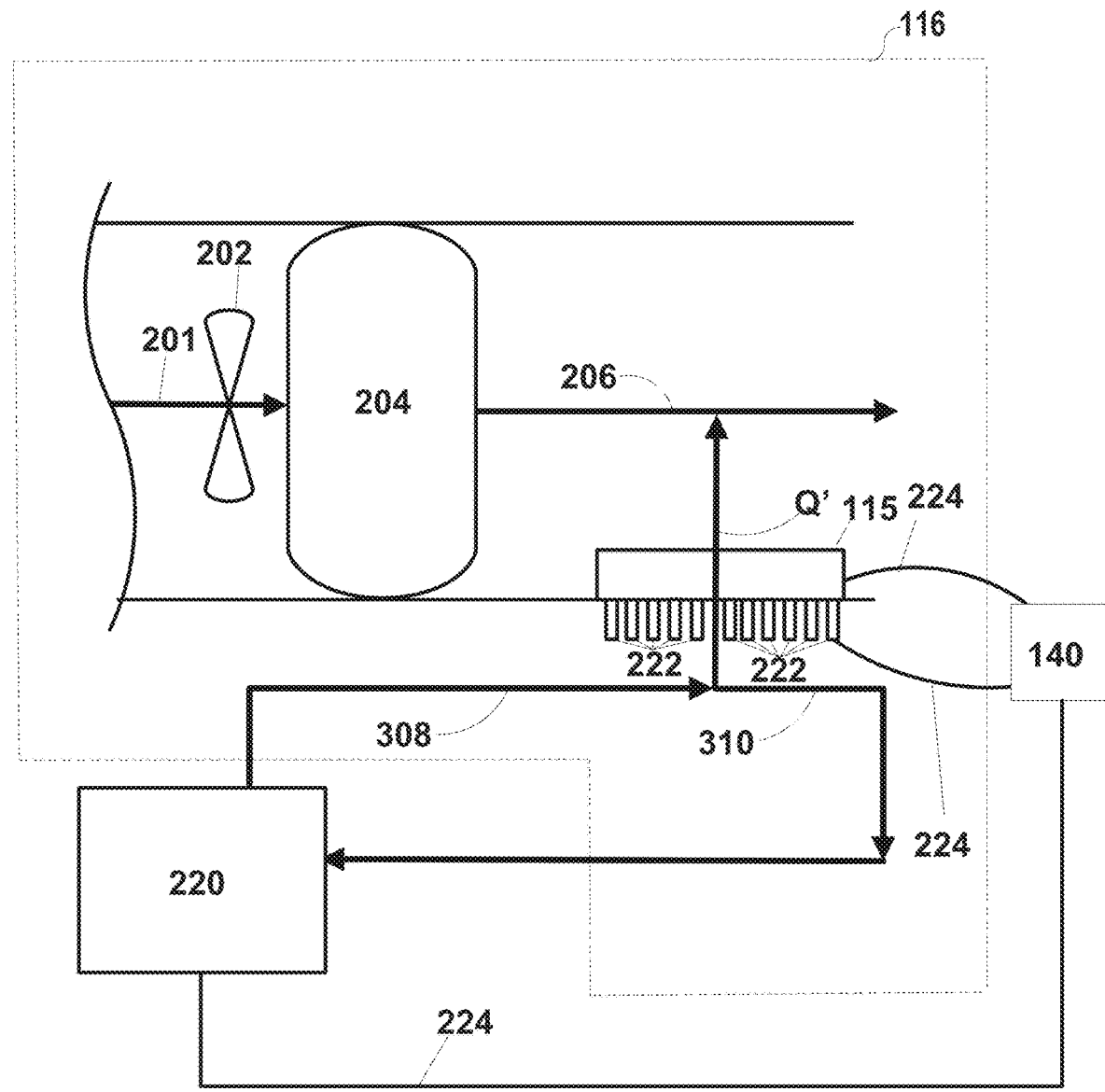
FIG. 3 illustrates a diagram of an example of a system utilizing the thermoelectric cooling apparatus to maintain a temperature of a component of the integrated power and thermal management system other than the thermal energy storage.

The thermoelectric cooling apparatus 115, the VCS 117, the TES 113, and/or (as shown in FIG. 3) the thermal load system 220 may be electrically powered by the electric source 140. The electric source 140 may provide electric power via the electric connectors 224. The electric connectors 224 may include, for example wires, circuits, electric cords, or electric cables.

The cooling reservoir 212 may include an apparatus that stores cooling capacity and/or absorbs thermal power. For example, the cooling reservoir 212 may store the cooling fluid 214, or any other example of gaseous or non-gaseous fluid. In some examples, the cooling reservoir 212 may include a reservoir that stores the cooling fluid 214. The cooling reservoir 212 may store cooling fluid 214 that was cooled or heated by the thermoelectric cooling apparatus 115. In some examples, the cooling reservoir 212 may supplement cooling provided by the VCS 117. For example, cooling fluid 214 from the cooling reservoir 212 may be applied to components of the electrical source 140 and/or the customer platform component 118.

The cooling fluid 214 may be gaseous or non-gaseous fluid stored in the cooling reservoir 212 and used to cool components of the IPTMS 100 or the customer platform component 118. Examples of the cooling fluid 214 may include water, water-based liquid solutions, glycerin, or oils suitable to provide cooling to the thermal load system 220. Alternatively or in addition, the cooling fluid 214 may include phase change materials or adsorption cycles such as an ammonia-water adsorption cycle.

The cooling stream 216 may be a channel that allows for a flow of fluid. The flow of fluid may be, for example, out of the TES 113. Alternatively or in addition, fluid flow through the cooling stream 216 may include the cooling fluid 214. During operation of the TMS 116, the cooling fluid 214 may be utilized to provide cooling capacity to the thermal load system 220. For example, the cooling stream 216 may carry the cooling fluid 214 to deliver sufficient cooling capacity to maintain the thermal load system 220 within a temperature range. Alternatively or in addition, fluid flow through the cooling stream 216 may include laminar flow, turbulent flow, or both. Alternatively or in addition, the cooling stream 216 may include internal structures that may disrupt the flow of fluid in the cooling stream 216 in order to facilitate, for example, turbulent flow. Alternatively or in addition, the cooling stream 216 may narrow in diameter from upstream to downstream. Alternatively or in addition, the cooling stream 216 may widen in diameter from upstream to downstream.

The return stream 218 may be a channel that allows for a flow of fluid. The flow of fluid may be, for example, into the TES 113. Alternatively or in addition, fluid flow through the return stream 218 may include the cooling fluid 214. Alternatively or in addition, fluid flow through the return stream 218 may include laminar flow, turbulent flow, or both. Alternatively or in addition, the return stream 218 may include internal structures that may disrupt the flow of fluid in the return stream 218 in order to facilitate, for example, turbulent flow. Alternatively or in addition, the return stream 218 may narrow in diameter from upstream to downstream. Alternatively or in addition, the return stream 218 may widen in diameter from upstream to downstream.

The thermal load system 220 may be a thermal energy generating system that utilizes the IPTMS 100. Alternatively or in addition, the thermal load system 220 may be a thermal energy generating system included in the IPTMS 100. In some examples, the thermal load system 220 may be powered by the electrical source 140. The thermal load system 220 may generate a thermal energy load and be assisted by the supply of cooling during operation. The IPTMS 100 may assist in cooling the thermal load system 220, and maintain the thermal load system 220 within a temperature range. Alternatively or in addition, the TES 113 may assist in cooling the thermal load system and maintain the thermal load system 220 within a temperature range. Alternatively or in addition, the thermoelectric cooling apparatus 115 may assist in cooling the thermal load system and maintain the thermal load system 220 within a temperature range, as shown in FIG. 3. In some examples, the thermal load system 220 may include the engine 102, the gearbox 104, the generator 106, the electrical bus 108 for the generator 106, or the power electronics 110. Alternatively or in addition, the thermal load system 220 may include the customer platform component 118.

The thermal load system 220 may operate in a thermal load system use state. The thermal load system use state may be the state of operation of the thermal load system 220 in which the thermal load system 220 produces a thermal load that exceeds the thermal threshold. Alternatively or in addition, the thermal load system use state may be the state of operation of the thermal load system 220 in which the thermal load system 220 uses an amount of electricity that exceeds an electric threshold. During operation of the thermal load system 220 in the thermal load system use state, the thermal load system 220 may be assisted by cooling capacity supplied by, for example, the TES 113 via the cooling fluid 214. Alternatively or in addition, the thermal load system 220 may consume cooling capacity supplied by, for example, the cooling fluid 214 during operation of the thermal load system 220 in the thermal load system use state. Alternatively or in addition, the cooling stream 216 and may route the cooling fluid 214 from, for example, the TES 113 to the thermal load system 220 in response to the thermal load system 220 operating in the thermal load system use state. Alternatively or in addition, the return stream 218 and may route the cooling fluid 214 to, for example, the TES 113 from the thermal load system 220 in response to the thermal load system 220 operating in the thermal load system use state. Alternatively or in addition, the depleted stream 208 and/or the recharged stream 210 may be suspended from operation in response to the thermal load system 220 operating in the thermal load system use state.

Alternatively, the thermal load system 220 may operate in a thermal load system recharge state. The thermal load system recharge state may be the state of operation of the thermal load system 220 in which the thermal load system 220 requires less than a threshold amount of cooling to avoid damage or destruction of the thermal load system 220. Alternatively or in addition, the thermal load system recharge state may be the state of operation of the thermal load system 220 in which the thermal load system 220 uses an amount of electricity that is less the electric threshold. Alternatively or in addition, the thermal load system recharge state may be the state of operation of the thermal load system 220 as a result of the thermal load system 220 not exceeding the thermal threshold. Supplying of cooling capacity to the thermal load system 220 may be suspended in response to the thermal load system 220 operating in the thermal load system recharge state. Alternatively or in addition, the electrical source 140 may produce available electrical capacity useable in components of the IPTMS 100 in response to the thermal load system 220 operating in the thermal load system recharge state. Alternatively or in addition, the cooling stream 216 and/or the return stream 218 may be suspended from operation in response to the thermal load system 220 operating in the thermal load system recharge state. Alternatively or in addition, the cooling fluid 214 may be rerouted from the cooling stream 216 and/or the return stream 218 into the depleted stream 208 in order to, for example, recharge the cooling capacity of the cooling fluid 214 in response to the thermal load system 220 operating in the thermal load system recharge state. Alternatively or in addition, the depleted stream 208 may route the cooling fluid 214 from, for example, the TES 113 to the thermoelectric cooling apparatus 115 in response to the thermal load system 220 operating in the thermal load system use state. Alternatively or in addition, the recharged stream 210 may route the cooling fluid 214 to, for example, the TES 113 from the thermoelectric cooling apparatus 115 in response to the thermal load system 220 operating in the thermal load system use state.

In some examples, the thermal threshold may be a thermal magnitude or thermal intensity of the thermal load produced by the thermal load system 220 that, when exceeded by the thermal load system 220, may result in suspending operation of the thermoelectric cooling apparatus 115. The thermal threshold may be caused to be exceeded by, for example, an increase in electrical capacity of the electrical source 140 directed to the thermal load system 220 compared to the amount of electrical capacity of the electrical source 140 directed to the thermal load system 220 when the thermal threshold was not exceeded, thus increasing the thermal energy produced by the thermal load system 220. Directing the electrical capacity of the electrical source 140 may inhibit the electrical source 140 from supplying electrical capacity to some other components, such as for example, the thermoelectric cooling apparatus 115. Alternatively or in addition, the thermal load produced by the thermal load system 220 dropping below the thermal threshold or not exceeding the thermal threshold may result in available electricity for other components, such as the thermoelectric cooling apparatus 115.

In some examples, a thermal load threshold may be a thermal magnitude or thermal intensity produced by the thermal load system 220 that, when dropped below by the thermal load system 220, may result in suspending operation of the VCS 117. Alternatively or in addition, the thermal load threshold may be a thermal magnitude or thermal intensity of a size that the thermal load threshold may be sufficiently maintained by the thermoelectric cooling apparatus 115 alone or in combination with other components.

In some examples, the electric threshold may be an amount of electrical load used by the thermal load system 220 that, when exceeded by the thermal load system 220, may result in suspending operation of the thermoelectric cooling apparatus 115. The electric threshold may be caused to be exceeded by, for example, an increase in the amount of electricity produced by the electrical source 140 directed to the thermal load system 220 compared to the amount of electricity produced by the electrical source 140 directed to the thermal load system 220 when the electric threshold was not exceeded. Increasing the amount of electricity directed by the electrical source 140 to the thermal load system 220 may inhibit the electrical source 140 from supplying electricity to some other components, such as for example, the thermoelectric cooling apparatus 115. Alternatively or in addition, the electricity used by the thermal load system 220 dropping below the electric threshold or not exceeding the electric threshold may result in available electricity for other components, such as the thermoelectric cooling apparatus 115.

The cooling fluid 214 may be stored in the cooling reservoir 212 included in, for example, the TES 113 with sufficient cooling capacity to maintain the thermal load system's 220 thermal load such that damage or destruction to the thermal load system 220 is avoided. The TES 113 may supply the cooling fluid 214 to the thermal load system 220 via the cooling stream 216. In some examples, the cooling fluid 214 in the cooling stream 216 may deplete or exhaust the cooling fluid's 214 cooling capacity by, for example, maintaining the thermal load system's 220 thermal load at a workable level. In response to the cooling fluid 214 depleting or exhausting cooling capacity, the cooling fluid 214 may be delivered back to the TES 113 for storage in the cooling reservoir 212. In some examples, this cycle may continue until a sufficient amount of the cooling fluid 214 in the cooling reservoir 212 has depleted or exhausted cooling capacity such that the cooling fluid 214 may benefit from recharge. The TES 113 may switch from the TES 113 use state to the TES 113 recharge state to recharge the cooling fluid's 214 cooling capacity.

As mentioned above, the TES 113 may operate in a TES use state. The TES use state may be the state of operation of the TES 113 in which the TES 113 supplies cooling capacity to the thermal load system 220. During operation of the TES 113 in the TES use state, the TES's 113 cooling capacity may be consumed as the cooling capacity of the TES 113 is used, for example, to maintain thermal conditions of the thermal load system 220. Alternatively or in addition, the cooling stream 216 may route the cooling fluid 214 from, for example, the TES 113 to the thermal load system 220 in response to the TES 113 operating in the TES 113 use state. Alternatively or in addition, the return stream 218 may route the cooling fluid 214 from, for example, the thermal load system 220 to the TES 113 in response to the TES 113 operating in the TES 113 use state.

Alternatively, the TES 113 may operate in a TES recharge state. The TES recharge state may be the state of operation of the TES 113 in which the TES 113 regenerates cooling capacity. In response to the TES 113 operating in the TES recharge state, supplying of cooling capacity from the TES 113 to components may be suspended. Alternatively or in addition, the cooling stream 216 and/or the return stream 218 may be suspended from operation in response to the TES 113 operating in the TES recharge state. Alternatively or in addition, the cooling fluid 214 may be rerouted from the cooling stream 216 and/or the return stream 218 into the depleted stream 208 in order to, for example, recharge the cooling capacity of the cooling fluid 214 in response to the TES 113 operating in the TES recharge state. Alternatively or in addition, the depleted stream 208 may route the cooling fluid 214 from, for example, the TES 113 to the thermoelectric cooling apparatus 115 in response to the TES 113 operating in the TES 113 use state. Alternatively or in addition, the recharged stream 210 may route the cooling fluid 214 from, for example, the thermoelectric cooling apparatus 115 to the TES 113 in response to the TES 113 operating in the TES use state.

Alternatively or in addition, the VCS 117 may recharge the TES 113 by cooling the cooling fluid 214. Alternatively or in addition, the electrical source 140 may produce available electric capacity in response to the TES 113 operating in the TES recharge state. The available electric capacity produced by the electrical source 140 may be utilized by other components in the IPTMS 110 to assist the recharging of the TES 113. For example, the available electric capacity of the electrical source 140 may be utilized by the thermoelectric cooling apparatus 115.

During operation of the thermal management system 116, cooling fluid 214 from the TES 113 may supply cooling capacity to various components of the thermal load system 220. When the cooling fluid 214 of the TES 113 sufficiently depletes cooling capacity, the TES 113, or more specifically the cooling fluid 214, may need to be recharged in order to, for example, regain the cooling fluid's 214 cooling capacity. The TES 113 may be recharged by, for example, the depleted cooling fluid 214 entering the depleted stream 208. Downstream from the TES 113 in the depleted stream 208, the cooling fluid 214 may encounter the thermoelectric cooling apparatus 115. The thermoelectric cooling apparatus 115 may, for example, facilitate the transfer an amount of heat via the first heat flux Q. The transfer of heat out of the cooling fluid 214 in the depleted stream 208 may result in the cooling fluid 214 regaining cooling capacity. The cooling fluid 214, now renewed with cooling capacity, may continue downstream of the thermoelectric cooling apparatus 115 into the recharged stream 210 and back into the TES 113. The TES's 113 cooling capacity may be thus recharged by receiving the cooling fluid 214 from the recharged stream 210.

FIG. 3 illustrates another example of a portion of the thermal management system 116. The thermal management system 116 may include additional or fewer components than those shown in FIG. 3. As explained above, the thermal management coolant loops 114 may include additional, fewer, or different coolant loops than shown in FIG. 1. Referring to FIG. 3, the thermal management coolant loops 114 may include a heated stream 308 and a cooled stream 310.

FIG. 3 illustrates one example of the thermoelectric cooling apparatus 115 positioned and configured to facilitate thermal communication between the discharge stream 206 and another portion of the thermal management system 116, namely the thermal load system 220. FIG. 3 shows the heated stream 308 and the cooled stream 310. During operation of the IPTMS 100, the thermal load system 220 may benefit from cooling. Thermal communication from the thermal load system 220 into the heated stream 308 may occur. The heated stream 308 may encounter the thermoelectric cooling apparatus 115. Alternatively or in addition, the thermoelectric cooling apparatus 115 may provide thermal communication between the heated stream 308 and the discharge stream 206. The contents of the heated stream 308 may be cooled in response to the thermoelectric cooling apparatus 115 spontaneously or forcefully drawing a second heat flux Q' away from the heated stream 308. In some examples, the contents of the heated stream 308 may have heat removed by, for example, the thermoelectric cooling apparatus 115 causing a second heat flux Q' from the heated stream 308 into the discharge stream 206. Alternatively or in addition, the second heat flux Q' may flow from the discharge stream 206 into the heated stream 308, thus raising the temperature of the contents of the heating stream 308. Thermal communication between portions of the IPTMS 100 may be direct or indirect. Alternatively or in addition, the second heat flux Q' may be spontaneous or forced. The thermoelectric cooling apparatus 115 may facilitate the second heat flux Q' either from a higher temperature stream to a lower temperature stream or a lower temperature stream to a higher temperature stream.

In some examples, the second heat flux Q' may be directed from the heated stream 308 to the discharge stream 206. Alternatively or in addition, the contents of the heated stream 308 may thus be cooled and continue to the cooled stream 310.

The heated stream 308 may be a channel that allows for the flow of fluid out of for example, the thermal load system 220. Fluid flow through the heated stream 308 may include laminar flow, turbulent flow, or both. The heated stream 308 may include internal structures that disrupt the flow of fluid in the heated stream 308 in order to, for example, facilitate turbulent flow. Alternatively or in addition, the heated stream 308 may narrow in diameter from upstream to downstream. Alternatively or in addition, the heated stream 308 may widen in diameter from upstream to downstream.

The cooled stream 310 may be a channel that allows for a flow of fluid. The flow of fluid may be, for example, into the thermal load system 220 and cool the thermal load system 220. Alternatively or in addition, fluid flow through the cooled stream 318 may include the cooling fluid 214. Alternatively or in addition, fluid flow through the cooled stream 318 may include laminar flow, turbulent flow, or both. Alternatively or in addition, the cooled stream 318 may include internal structures that may disrupt the flow of fluid in the cooled stream 318 in order to facilitate, for example, turbulent flow. Alternatively or in addition, the cooled stream 318 may narrow in diameter from upstream to downstream. Alternatively or in addition, the cooled stream 318 may widen in diameter from upstream to downstream.

Figure 4:
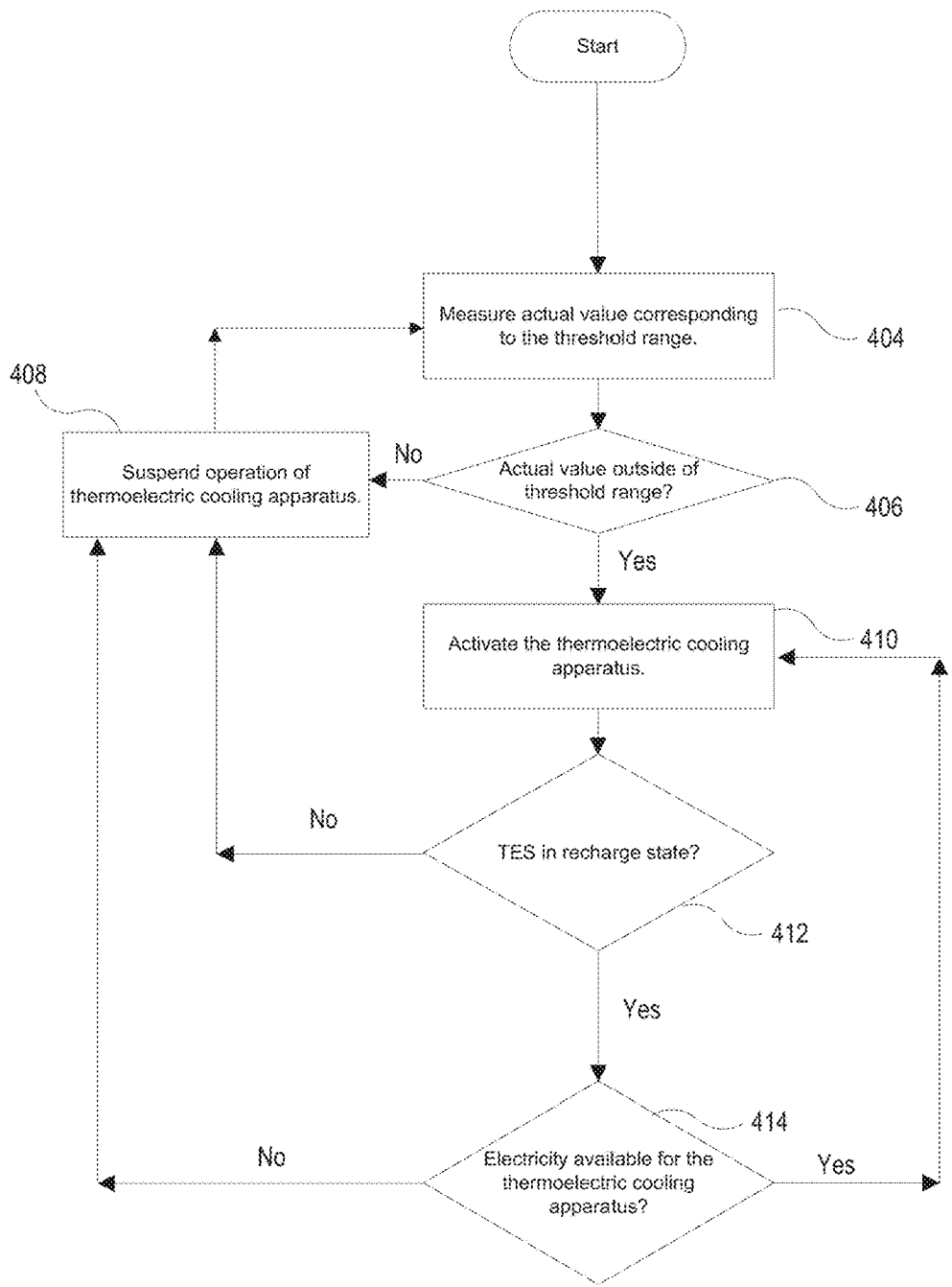
FIG. 4 illustrates a method of recharging the thermal energy storage.

Referring now to FIG. 4, FIG. 4 is a flowchart for a method to cool systems or subsystems. The method may include measuring (404) a value of the operating parameter that affects a cooling capacity of the primary cooling system. Alternatively or in addition, the method may include determining (406) that the value of the operating parameter is outside of the predetermined operating range. Alternatively or in addition, the method may include activating (410) the thermoelectric cooling apparatus 115 in response to determining that the value is outside of the predetermined operating range. Alternatively or in addition, the method may include suspending operation (408) the thermoelectric cooling apparatus 115 in response to determining that the value is not outside of the predetermined range. Alternatively or in addition, the method may include determining (412) the TES 113 is operating in a recharge state. Alternatively or in addition, the method may include suspending (408) operation of the thermoelectric cooling apparatus 115 in response to the TES 113 not operating in the TES recharge state. Alternatively or in addition, the method may include determining (414) an availability of electricity for thermoelectric cooling apparatus 115 to operate. Alternatively or in addition, the method may include suspending (408) operation of the thermoelectric cooling apparatus 115 in response to electricity not being available for the thermoelectric cooling apparatus 115. The thermoelectric cooling apparatus may cool the TES 113, the customer platform component 118, or another component in response to the thermoelectric cooling apparatus being in operation.

Alternatively or in addition, operation of the thermoelectric cooling apparatus 115 may be suspended in response to the thermal load system 220 exceeding the thermal threshold. Alternatively or in addition, operation of the VCS 117 may be suspended in response to the thermal load system 220 dropping below the thermal load threshold.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

The subject-matter of the disclosure may also relate, among others, to the following aspects:

1. A system comprising:
    a primary cooling system configured to cool a thermal load;
    a supplemental cooling system configured to supplement the primary cooling system and cool the thermal load, the primary cooling system configured to supply cooling to the supplemental cooling system in response to an operation of the supplemental cooling system in a recharge state; and
    a thermoelectric cooling apparatus configured to supply cooling to the supplemental cooling system in response to the operation of the supplemental cooling system in the recharge state, to an availability of electricity for the thermoelectric cooling apparatus, and to an operating parameter of the primary cooling system falling outside a predetermined range, wherein the operating parameter affects a cooling capacity of the primary cooling system.

2. The system of aspect 1, wherein the primary cooling system comprises a vapor cycle system, the electrical source comprises a gas turbine engine, and the supplemental cooling system comprises a thermal energy storage.

3. The system of any of aspects 1 to 2, wherein the thermoelectric cooling apparatus comprises a Peltier cooler.

4. The system of any of aspects 1 to 3, wherein the thermoelectric cooling apparatus is configured to draw an amount of heat from the supplemental cooling system into the primary cooling system.

5. The system of any of aspects 1 to 4, wherein the supplemental cooling system comprises a cooling reservoir configured to store a cooling fluid.

6. The system of any of aspects 1 to 5, wherein the thermoelectric cooling apparatus further comprises fins.

7. The system of any of aspects 1 to 6, wherein the availability of electricity for the thermoelectric cooling apparatus results from a decrease in the thermal load below a thermal threshold.

8. The system of any of aspects 1 to 7, wherein the availability of electricity for the thermoelectric cooling apparatus results from an amount of electricity used by the thermal load being below an electric threshold.

9. A method comprising:
  measuring a value of an operating parameter that affects a cooling capacity of the primary cooling system;
  determining that the value is outside of a predetermined operating range;
  determining a supplemental cooling system is operating in a recharge state; and
  cooling a supplemental cooling system with the thermoelectric cooling apparatus in response to the supplemental cooling system operating in the recharge state, to an availability of electricity for the thermoelectric cooling apparatus, and to the determining that the value is outside of the predetermined operating range.

10. The method of aspect 9, wherein the thermoelectric cooling apparatus comprises a Peltier cooler.

11. The method of any of aspects 9 to 10 further comprising drawing an amount of heat from the supplemental cooling system and directing the amount of heat into the primary cooling system.

12. The method of any of aspects 9 to 11, wherein the primary cooling system comprises a gas cooler.

13. The method of any of aspects 9 to 12, wherein the predetermined operating range comprises a predetermined temperature range.

14. The method of any of aspects 9 to 13, wherein the predetermined operating range comprises a predetermined ambient temperature range.

15. The method of any of aspects 9 to 14, wherein the recharging further comprises:
  suspending operation of the thermoelectric cooling apparatus in response to detection of the supplemental cooling system operating outside of the recharge state.

16. The method of any of aspects 9 to 15, wherein the recharging further comprises:
  suspending operation of the thermoelectric cooling apparatus in response to detection electricity not being available for the thermoelectric cooling apparatus.

17. The method of any of aspects 9 to 16, wherein the recharging further comprises:
  suspending operation of the thermoelectric cooling apparatus in response to detection of the value being within the threshold range.

18. The method of any of aspects 9 to 17, wherein the supplemental cooling system comprises a cooling fluid.

19. A system comprising:
  a primary cooling system configured to cool a thermal load;
  a supplemental cooling system configured to provide cooling which supplements the primary cooling system, the primary cooling system configured to supply cooling to the supplemental cooling system in response to an operation of the supplemental cooling system in a recharge state; and
  a thermoelectric cooling apparatus configured to cool an amount of heat received from the thermal load in response to an availability of electricity for the thermoelectric cooling apparatus and to the primary cooling system suspending operation in response to the thermal load being below a thermal load threshold.

20. The system of aspect 19, wherein the thermoelectric cooling apparatus comprises a Peltier cooler.

What is claimed is:

1. A method comprising:
  cooling a thermal load by a vapor cycle system;
  supplementing the vapor cycle system by cooling the thermal load by a thermal energy storage;
  cooling the thermal energy storage in a recharge state of the thermal energy storage by a Peltier cooler and the vapor cycle system; and
  drawing an amount of heat from the thermal energy storage into the vapor cycle system.

2. The method of claim 1, wherein the vapor cycle system comprises a gas cooler and the Peltier cooler draws heat from the thermal energy storage into a discharge stream of the gas cooler.

3. The method of claim 1 further comprising suspending operation of the Peltier cooler in response to the thermal energy storage no longer being in the recharge state.

4. The method of claim 1, wherein the thermal energy storage comprises a cooling reservoir storing a cooling fluid.

5. The method of claim 1 further comprising transferring heat via fins of the Peltier cooler from the thermal energy storage into a discharge stream of the vapor cycle system.

6. The method of claim 1 further comprising powering the Peltier cooler by an electric generator, which is powered by a gas turbine engine.

\* \* \* \* \*